US010128815B2

(12) United States Patent
Mukai

(10) Patent No.: US 10,128,815 B2
(45) Date of Patent: Nov. 13, 2018

(54) BRANCHING DEVICE

(71) Applicant: Murata Manufacturing Co., Ltd., Nagaokakyo-shi, Kyoto-fu (JP)

(72) Inventor: Takao Mukai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 47 days.

(21) Appl. No.: 15/462,945

(22) Filed: Mar. 20, 2017

(65) Prior Publication Data

US 2017/0194939 A1    Jul. 6, 2017

Related U.S. Application Data

(63) Continuation of application No. PCT/JP2015/076607, filed on Sep. 18, 2015.

(30) Foreign Application Priority Data

Oct. 10, 2014   (JP) .................. 2014-209156

(51) Int. Cl.
*H03H 9/70* (2006.01)
*H03H 9/72* (2006.01)
(Continued)

(52) U.S. Cl.
CPC ............ *H03H 9/70* (2013.01); *H03H 9/0576* (2013.01); *H03H 9/64* (2013.01); *H03H 9/725* (2013.01)

(58) Field of Classification Search
CPC .................. H03H 7/09; H03H 9/70–9/725
(Continued)

(56) References Cited

U.S. PATENT DOCUMENTS 7,479,846 B2 *   1/2009  Inoue ................... H03H 9/0576
                                                    333/133
7,777,592 B2 *   8/2010  Nishigaki .............. H03H 9/706
                                                    333/133
(Continued)

FOREIGN PATENT DOCUMENTS

JP    2007-174100 A    7/2007
JP    2009-021895 A    1/2009
(Continued)

OTHER PUBLICATIONS

Official Communication issued in corresponding International Application PCT/JP2015/076607, dated Oct. 27, 2015.

*Primary Examiner* — Dean Takaoka
*Assistant Examiner* — Alan Wong
(74) *Attorney, Agent, or Firm* — Keating & Bennett, LLP

(57) ABSTRACT

A branching device that separates signals of different pass bands increases attenuation characteristics outside the pass bands, and increases isolation characteristics. The branching device includes a duplexer including a transmission filter and a reception filter electrically connected to an antenna terminal, and a filter electrically connected to the antenna terminal. An inductor is electrically connected between the antenna terminal and a ground potential. The transmission filter is a ladder filter including serial arm resonators and parallel arm resonators, and each includes a polarized inductor electrically connected between the parallel arm resonators and a ground potential. The inductor and the polarized inductors inductively couple with each other, and a distance between the inductor and the polarized inductors is shorter than a distance between the polarized inductors.

18 Claims, 8 Drawing Sheets

(51) Int. Cl.
*H03H 9/64* (2006.01)
*H03H 9/05* (2006.01)

(58) Field of Classification Search
USPC .................................. 333/132–136
See application file for complete search history.

(56) References Cited

U.S. PATENT DOCUMENTS

| | | | |
|---|---|---|---|
| 8,138,854 B2* | 3/2012 | Hara | H03H 9/0028 333/126 |
| 9,160,304 B2* | 10/2015 | Mori | H03H 9/725 |
| 9,294,070 B2* | 3/2016 | Kiwitt | H03H 7/42 |
| 9,356,576 B2* | 5/2016 | Okuda | H03H 9/0576 |
| 9,413,335 B2* | 8/2016 | Onodera | H03H 9/6433 |
| 2009/0147707 A1 | 6/2009 | Koga et al. | |
| 2010/0188165 A1 | 7/2010 | Nakamura et al. | |
| 2011/0221542 A1 | 9/2011 | Kihara | |
| 2015/0137909 A1 | 5/2015 | Okuda et al. | |

FOREIGN PATENT DOCUMENTS

| | | |
|---|---|---|
| WO | 2007/102560 A1 | 9/2007 |
| WO | 2010/067497 A1 | 6/2010 |
| WO | 2014/034373 A1 | 3/2014 |

* cited by examiner

BRANCHING DEVICE

CROSS REFERENCE TO RELATED APPLICATIONS

This application claims the benefit of priority to Japanese Patent Application No. 2014-209156 filed on Oct. 10, 2014 and is a Continuation Application of PCT Application No. PCT/JP2015/076607 filed on Sep. 18, 2015. The entire contents of each application are hereby incorporated herein by reference.

BACKGROUND OF THE INVENTION

1. Field of the Invention

The present invention relates to a branching device, and particularly relates to a branching device including a plurality of filter devices and inductors.

2. Description of the Related Art

Branching devices such as duplexers that separate transmission signals and reception signals by frequency using surface acoustic wave filters (SAW filters) or the like are widely used in communication devices such as cellular phones and smartphones.

This type of branching device uses a ladder filter, in which a plurality of surface acoustic wave resonators are connected in ladder form, in order to widen a pass band, which is a frequency band where the transmission signals and the reception signals are allowed to pass. Furthermore, a configuration in which a plurality of inductors are added to the filters is also used to achieve impedance matching with a transmission/reception antenna and adjust the pass band characteristics of each filter.

Japanese Unexamined Patent Application Publication No. 2009-21895 discloses a configuration of a shared antenna device including first to third filters that are electrically connected to an antenna and that have pass bands at mutually different frequencies, in which an inductor for impedance matching is provided between an antenna terminal and a ground potential.

Additionally, Japanese Unexamined Patent Application Publication No. 2007-174100 discloses a configuration of a duplexer that separates transmission signals and reception signals, in which an inductor for antenna matching and an inductor for adjusting the characteristics of a transmission filter (extension inductor) are formed as meandering lines within a laminated substrate. In the duplexer disclosed in Japanese Unexamined Patent Application Publication No. 2007-174100, isolation characteristics are improved by making magnetic fields produced by the inductors orthogonal to each other to reduce the influence of electromagnetic fields acting on each other.

In communication devices such as cellular phones, it is necessary to further reduce the size of the device and precisely separate signals having a plurality of different pass bands. As such, in a branching device having a plurality of filters as described above, it is necessary to improve attenuation characteristics for signals outside of the target pass bands of the filters and improve the isolation characteristics among the filters.

SUMMARY OF THE INVENTION

Preferred embodiments of the present invention provide a branching device that separates signals of a plurality of different pass bands with increased attenuation characteristics outside the pass bands and increased isolation characteristics.

A branching device according to a preferred embodiment of the present invention includes first, second, third, and fourth signal terminals, first and second filters, and first, second, and third inductors. The first filter is electrically connected to the first to third signal terminals, and provides first and second pass bands that are mutually different from each other. The second filter is electrically connected to the first and fourth signal terminals, and provides a third pass band that is different from the first and second pass bands. The first inductor is electrically connected between the first signal terminal and a ground potential. The second inductor is electrically connected between the first filter and a ground potential. The third inductor is electrically connected between the second filter and a ground potential. The first inductor inductively couples with the second inductor and the third inductor. Each of a distance between the first inductor and the second inductor and a distance between the first inductor and the third inductor is shorter than a distance between the second inductor and the third inductor.

Preferably, for example, the distance between the first inductor and the second inductor is the same or substantially the same as the distance between the first inductor and the third inductor.

Preferably, for example, a coupling coefficient between the first inductor and the second inductor and a coupling coefficient between the first inductor and the third inductor are both within a range of greater than or equal to about 0.04 and less than or equal to about 0.07.

Preferably, for example, the first filter includes a first ladder filter that provides the first pass band and includes a first serial arm resonator and a first parallel arm resonator and a longitudinally coupled resonator filter that provides the second pass band.

Preferably, for example, the second filter includes a second ladder filter that provides the third pass band and includes a second serial arm resonator and a second parallel arm resonator.

Preferably, for example, the first filter includes a first serial arm resonator and a first parallel arm resonator. The second filter includes a second serial arm resonator and a second parallel arm resonator. The second inductor is electrically connected between the first parallel arm resonator and a ground potential, and the third inductor is electrically connected between the second parallel arm resonator and a ground potential.

Preferably, for example, the first filter includes a plurality of first parallel arm resonators, and the second filter includes a plurality of second parallel arm resonators. The second inductor is electrically connected between at least two parallel arm resonators of the plurality of first parallel arm resonators and a ground potential. The third inductor is electrically connected between at least two parallel arm resonators of the plurality of second parallel arm resonators and a ground potential.

Preferably, for example, the branching device further includes a fifth signal terminal. The first filter includes a first filter that is electrically connected to the first and second signal terminals and provides the first pass band, and a second filter that is electrically connected to the first and third signal terminals and provides the second pass band. The second filter includes a third filter that is electrically connected to the first and fourth signal terminals and provides the third pass band, and a fourth filter that is electrically connected to the first and fifth signal terminals and provides a fourth pass band that is different from the third pass band.

Preferably, for example, the first to fourth signal terminals are provided on a circuit board. The first filter is included in a first filter chip mounted on the circuit board. The second filter is included in a second filter chip mounted on the circuit board. The first inductor is included in an inductor chip mounted on the circuit board. The second inductor is disposed on the circuit board to at least partially overlap with the first filter chip when the circuit board is viewed in plan view. The third inductor is disposed on the circuit board to at least partially overlap with the second filter chip when the circuit board is viewed in plan view.

According to branching devices of various preferred embodiments of the present invention, attenuation characteristics outside pass bands are able to be increased and isolation characteristics are able to be increased.

The above and other elements, components, features, steps, characteristics, and advantages of the present invention will become more apparent from the following detailed description of the preferred embodiments with reference to the attached drawings.

DETAILED DESCRIPTION OF THE PREFERRED EMBODIMENTS

Figure 1:
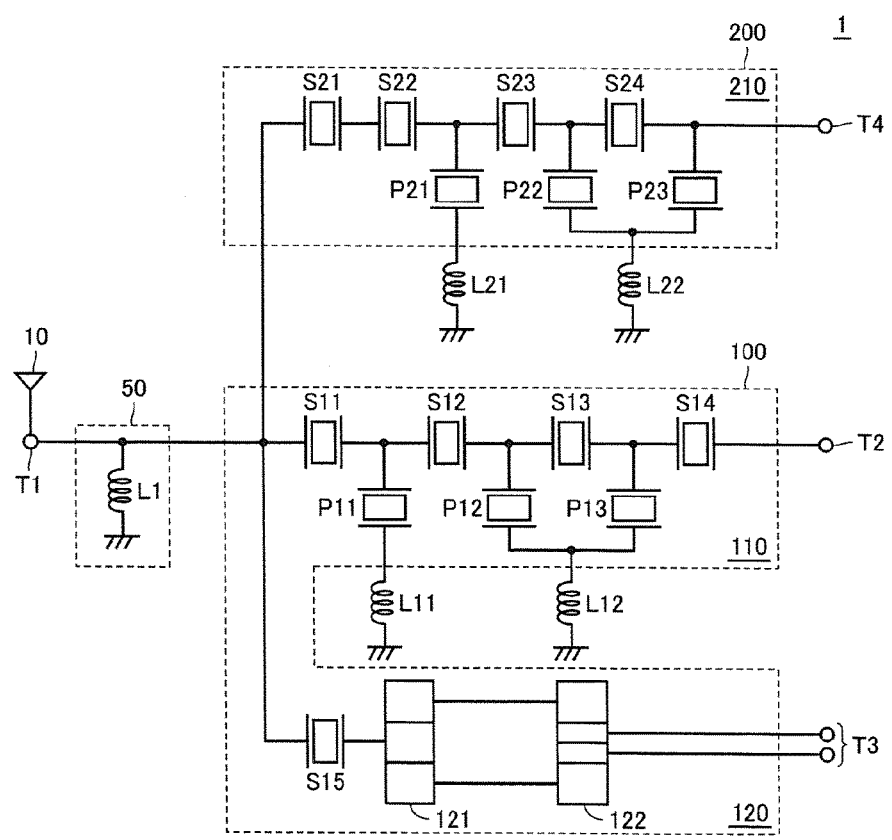
FIG. 1 is a schematic circuit diagram showing a branching device according to a first preferred embodiment of the present invention.

Hereinafter, preferred embodiments of the present invention will be described in detail with reference to the drawings. Identical or corresponding elements and components in the drawings will be identified by the same reference numerals and descriptions thereof will not be repeated.

First Preferred Embodiment

FIG. 1 is a schematic circuit diagram showing a branching device 1 according to a first preferred embodiment of the present invention. As shown in FIG. 1, the branching device 1 preferably is a triplexer, which includes a duplexer 100 and a filter 200 that are each electrically connected to an antenna 10 by an antenna terminal T1.

The antenna terminal T1, which corresponds to a first signal terminal, is electrically connected to a ground potential with an inductor L1 included in an inductor chip 50 provided therebetween. The inductor L1 provides impedance matching between the branching device 1 and the antenna 10, and corresponds to a first inductor.

The duplexer 100, which corresponds to a first filter, includes a transmission filter 110 with a first pass band (between about 704 MHz and about 716 MHz, for example) and a reception filter 120 with a second pass band different from the first pass band (between about 734 MHz and about 756 MHz, for example). The filter 200 includes a transmission filter 210 with a third pass band different from the first and second pass bands (between about 777 MHz and about 787 MHz, for example).

The transmission filter 110 is a ladder filter electrically connected between the antenna terminal T1 and a transmission terminal T2. A transmission signal received at the transmission terminal T2 is filtered by the ladder filter and output from the antenna terminal T1. The transmission filter 110 includes serial arm resonators S11 to S14, which are electrically connected in series between the antenna terminal T1 and the transmission terminal T2, and parallel arm resonators P11 to P13.

One end of the parallel arm resonator P11 is electrically connected to a connection node between the serial arm resonators S11 and S12, and another end of the parallel arm resonator P11 is electrically connected to a ground potential with an inductor L11 provided therebetween. One end of the parallel arm resonator P12 is electrically connected to a connection node between the serial arm resonators S12 and S13, and another end of the parallel arm resonator P12 is electrically connected to a ground potential with an inductor L12 that corresponds to a second inductor provided therebetween. One end of the parallel arm resonator P13 is electrically connected to a connection node between the serial arm resonators S13 and S14, and another end of the parallel arm resonator P13 is electrically connected to a connection node between the parallel arm resonator P12 and the inductor L12. In other words, the parallel arm resonator P13 is also electrically connected to a ground potential with the inductor L12 provided therebetween.

The reception filter 120 is a balanced filter electrically connected between a reception terminal T3, which corresponds to second and third signal terminals, and the antenna terminal T1. More specifically, the reception filter 120 includes longitudinally coupled resonator elastic wave filters. The reception filter 120 includes a surface acoustic wave resonator S15 and longitudinally coupled resonator elastic wave filters 121 and 122. The reception terminal T3 is a pair of balanced signal terminals that transmit signals at mutually opposite or substantially mutually opposite phases.

One end of the surface acoustic wave resonator S15 is electrically connected to the antenna terminal, and another end of the surface acoustic wave resonator S15 is electrically connected to the longitudinally coupled resonator elastic wave filter 121. The longitudinally coupled resonator elastic wave filter 121 and the longitudinally coupled resonator elastic wave filter 122 are longitudinally electrically connected to each other and implement balanced-unbalanced transforming operations. The reception filter 120 transforms an unbalanced signal received by the antenna 10 to a balanced signal by the surface acoustic wave resonator S15 and outputs the balanced signal to the reception terminal T3.

The reception filter 120 defines and functions as a common reception filter that is able to receive both a reception signal in a band of the transmission filter 110 (Band 17) and a reception signal in a band of the transmission filter 210 (Band 13).

The transmission filter 210 included in the filter 200 that corresponds to the second filter is a ladder filter electrically connected between a transmission terminal T4, which corresponds to a fourth signal terminal, and the antenna terminal T1. A transmission signal received at the transmission terminal T4 is filtered by the transmission filter 210 and output from the antenna terminal T1. The transmission filter 210 includes serial arm resonators S21 to S24, which are electrically connected in series between the antenna terminal T1 and the transmission terminal T4, and parallel arm resonators P21 to P23.

One end of the parallel arm resonator P21 is electrically connected to a connection node between the serial arm resonators S22 and S23, and another end of the parallel arm resonator P21 is electrically connected to a ground potential with an inductor L21 provided therebetween. One end of the parallel arm resonator P22 is electrically connected to a connection node provided in the serial arm of the serial arm resonators S23 and S24, and another end of the parallel arm resonator P22 is electrically connected to a ground potential with an inductor L22 that corresponds to a third inductor provided therebetween. One end of the parallel arm resonator P23 is electrically connected to a serial arm electrically connected to the transmission terminal T4, and another end of the parallel arm resonator P23 is electrically connected to a connection node between the parallel arm resonator P22 and the inductor L22. In other words, the parallel arm resonator P23 is also electrically connected to a ground potential with the inductor L22 provided therebetween.

The numbers and electrical connection states of the serial arm resonators and the parallel arm resonators in the transmission filters 110 and 210 are not limited to those shown in FIG. 1, and may be selected, for example, according to predetermined or desired pass bands.

The inductors (that are electrically connected between the parallel arm resonators and the ground potential in ladder filters (for example, the inductors L11, L12, L21, and L22 electrically connected to the transmission filters 110 and 210) are referred to as "extension inductors (extension coils)," and are included to provide a series electrical connection of a load capacitance in an oscillation circuit. The inductors that are electrically connected between a plurality of parallel arm resonators and the ground potential (for example, the inductors L12 and L22) are also referred to as "polarized inductors (polarized coils)", and are included to provide an attenuation pole at a desired frequency and increase attenuation in a high-frequency range.

Figure 2:
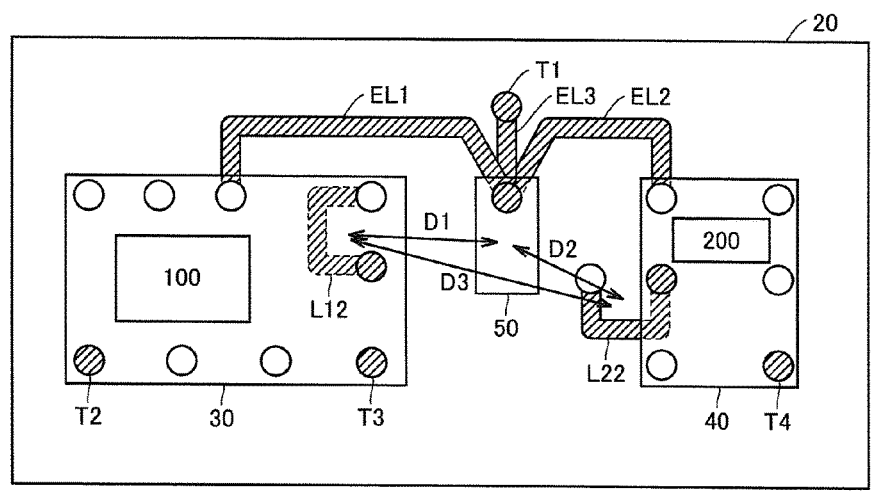
FIG. 2 is a diagram showing a first example of the overall arrangement on a circuit board of the respective elements and components of the branching device shown in FIG. 1.

FIG. 2 is a diagram showing the overall arrangement on a circuit board 20 of the respective elements and components of the branching device shown in FIG. 1.

As shown in FIG. 2, a filter chip 30 corresponding to a first filter chip that includes the duplexer 100, a filter chip 40 corresponding to a second filter chip that includes the filter 200, and the inductor chip 50, which includes the inductor L1, are mounted on the circuit board 20.

The filter chip 30 and the inductor chip 50 are electrically connected by a pattern interconnect EL1 on the circuit board 20, and the filter chip 40 and the inductor chip 50 are electrically connected by a pattern interconnect EL2 on the circuit board 20. The inductor chip 50 is electrically connected to the antenna terminal T1 by a pattern interconnect EL3. The pattern interconnect EL1, the pattern interconnect EL2, and the pattern interconnect EL3 are each electrically connected to a shared connection point. One end of the filter chip 30, one end of the filter chip 40, and one end of the inductor chip 50 are electrically connected to the antenna terminal T1 through the shared connection point. Another end of the inductor chip 50 is electrically connected to a ground potential.

The polarized inductor L12, which is electrically connected to the transmission filter 110 of the duplexer 100, and the polarized inductor L22, which is electrically connected to the transmission filter 210 of the filter 200, are defined by winding pattern interconnects on the circuit board 20. The inductors L12 and L22 are at least partially or completely disposed in locations that overlap with the filter chips 30 and 40, respectively, when the circuit board 20 is viewed in plan view. Accordingly, a substantial mounting area on the circuit board 20 is able to be conserved.

A branching device with filters for two bands may be included in a mobile device, for example, a cellular phone or a smartphone, and it is thus desirable that the branching device be made as small as possible.

However, if the filters for two bands with mutually different pass bands are brought close to each other as a result of the device being made smaller, signals passing through the one filter (a "partner" filter) may influence signals passing through the other filter. This may lead to a drop in signal quality, particularly of the reception signals in the reception filter, where pass bands are commonly included. Thus, it is desirable to both reduce the size of the device as a whole and increase the isolation characteristics between the filters.

In the first preferred embodiment, to increase the isolation characteristics between the filters, the inductors L12 and L22 of the transmission filters 110 and 210 are disposed near the inductor chip 50 that includes the inductor L1. Accordingly, inductive coupling between the inductor L1 and the inductor L12 and inductive coupling between the inductor L1 and the inductor L22 are able to be provided.

The inductive coupling between an input-side (antenna-side) inductor and an output-side (filter-side) inductor provides a signal path, in the space between the inductors, that is different from the signal paths provided by the pattern interconnects. By adjusting parameters, for example, inductance, the influence of the signals passing through the partner-side band is able to be significantly reduced or prevented by a signal passing through the signal path provided by the inductive coupling. For example, in the target frequency band, by transmitting, with inductive coupling, a signal with the same or similar amplitude but the opposite or substantially opposite phase, unnecessary signals passing through the filter are able to be significantly reduced or eliminated.

Accordingly, the signal attenuation of the pass band for the partner-side band in each of the filters is able to be increased, and thus the isolation characteristics between the filters are able to be improved.

More specifically, as shown in FIG. 2, the inductor chip 50 is disposed between the two filter chips 30 and 40 on the circuit board 20, and thus the inductors L21 and L22 and the inductor L1 are disposed near each other.

Inductive coupling is proportional to a coupling coefficient κ, and the coupling coefficient κ increases with the distance between inductors being smaller. It is thus desirable that the inductors L21 and L22 be disposed as close as possible to the inductor chip 50 in order to increase the isolation characteristics.

For example, assuming a distance between the inductor chip 50 and the inductor L12 is represented by D1, a distance between the inductor chip 50 and the inductor L22 is represented by D2, and a distance between the inductors L12 and 22 is represented by D3, D1 and D2 are preferably smaller than D3 (D1<D3 and D2<D3) and D1 and D2 are preferably equal or substantially equal to each other (D1≈D2), as shown in FIG. 2.

The isolation characteristics of the branching device according to the first preferred embodiment, which includes the arrangement shown in FIG. 2, is described below with respect to FIGS. 3 to 8. FIGS. 3 to 7 indicate isolation characteristics according to two cases, specifically, when the polarized inductor on the partner band side is sufficiently spaced from the inductor chip 50 so that no inductive coupling or substantially no inductive coupling occurs, a case where the polarized inductor of that band is significantly reduced or prevented from inductively coupling, and a case where the polarized inductor is inductively coupled. In FIGS. 3 to 7, the vertical axis represents insertion loss [dB] and the horizontal axis represents frequency [MHz]. In FIG. 8, the vertical axis represents insertion loss [dB] and the horizontal axis represents the coupling coefficient κ.

Figure 3:
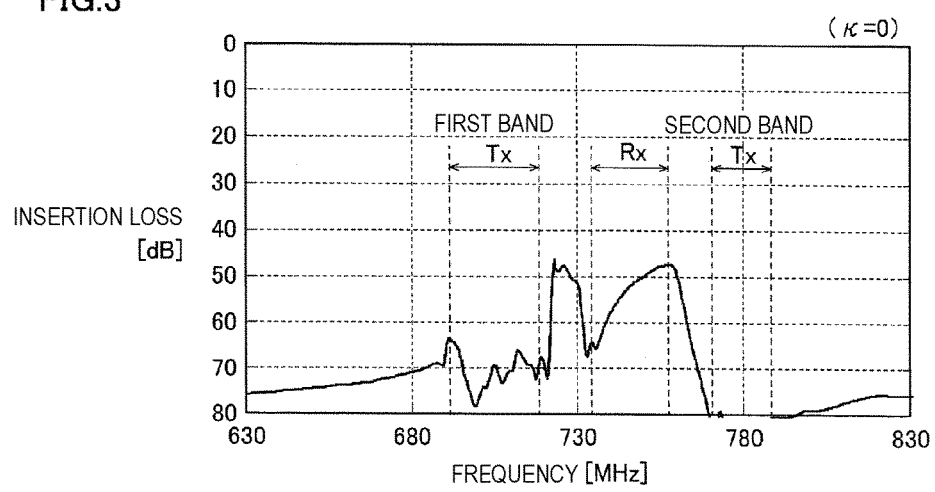
FIG. 3 is a first diagram showing a relationship between inductive coupling of an inductor and isolation characteristics with respect to a first band.
Figure 4:
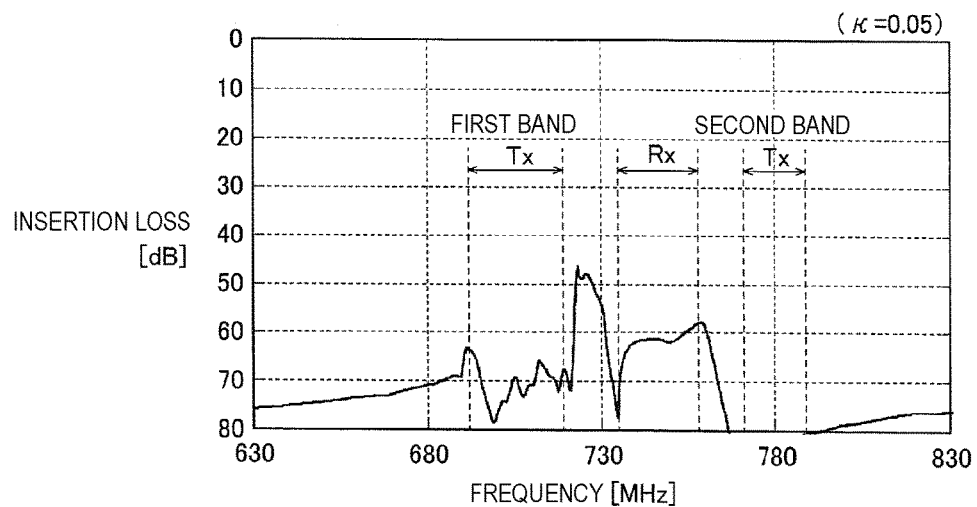
FIG. 4 is a second diagram showing a relationship between inductive coupling of an inductor and isolation characteristics with respect to the first band.

FIGS. 3 and 4 are graphs showing a relationship between the coupling coefficient for the first band (Band 17) on the transmission filter 110 side and the isolation characteristics. FIG. 3 shows results of a simulation in the case where the coupling coefficient κ is set to 0 to significantly reduce or prevent inductive coupling, and FIG. 4 shows results of a simulation in the case where the coupling coefficient κ is set to about 0.05 to cause inductive coupling.

Comparing FIGS. 3 and 4, insertion loss between about 734 MHz and about 756 MHz, which is the pass band of the common reception filter 120, is significantly reduced by the inductive coupling. In other words, inductive coupling between the input-side inductor L1 and the polarized inductor L12 increases the isolation characteristics in the reception-side pass band (Rx band).

Figure 5:
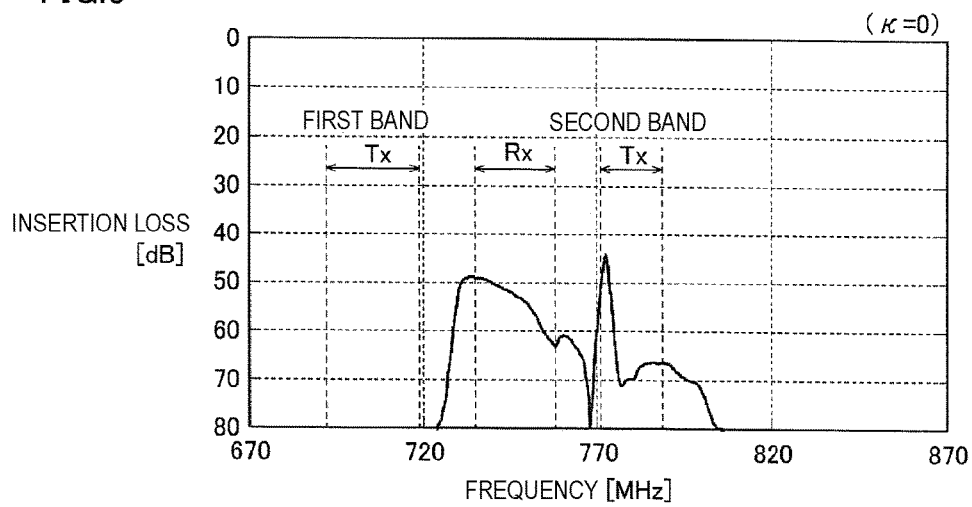
FIG. 5 is a first diagram showing a relationship between inductive coupling of an inductor and isolation characteristics with respect to a second band.
Figure 6:
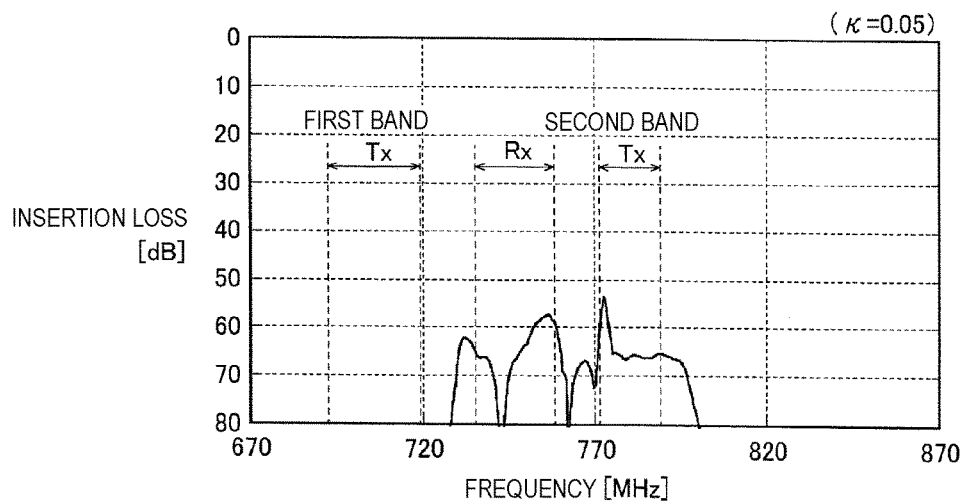
FIG. 6 is a second diagram showing a relationship between inductive coupling of an inductor and isolation characteristics with respect to the second band.

FIGS. 5 and 6 are graphs showing a relationship between the coupling coefficient for the second band (Band 13) on the transmission filter 210 side and the isolation characteristics. FIG. 5 shows results of a simulation in the case where the coupling coefficient κ is set to 0 to significantly reduce or prevent inductive coupling, and FIG. 6 shows results of a simulation in the case where the coupling coefficient κ is set to about 0.05 to cause inductive coupling.

Comparing FIGS. 5 and 6, insertion loss between about 734 MHz and about 756 MHz, which is the common reception pass band, is significantly reduced by the inductive coupling. In other words, adjusting the coupling coefficient κ to about 0.05 to cause inductive coupling between the input-side inductor L1 and the polarized inductor L22 provides a signal path between the input-side inductor L1 and the polarized inductor L22 that increases the isolation characteristics in the Rx band.

Figure 7:
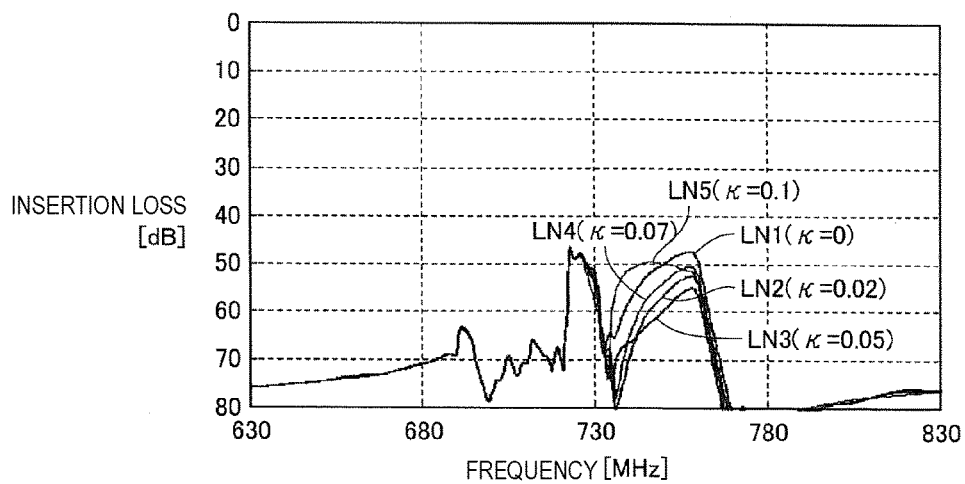
FIG. 7 is a diagram showing isolation characteristics of a reception pass band when a coupling coefficient of an inductor is varied, with respect to the first band.
Figure 8:
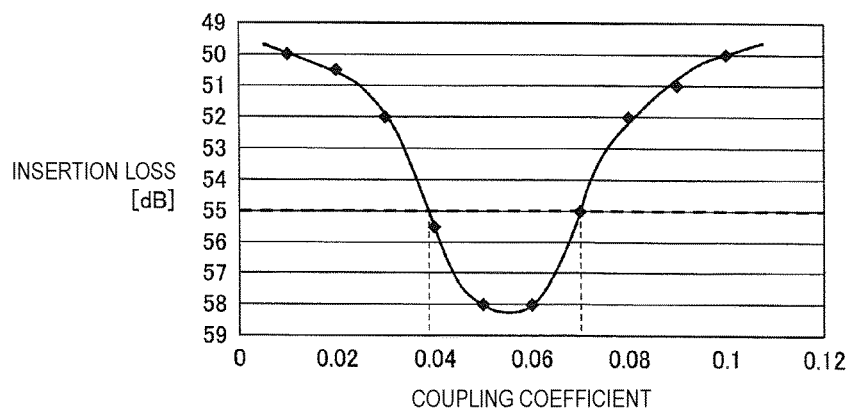
FIG. 8 is a diagram showing a coupling coefficient and isolation characteristics of a reception pass band.

FIG. 7 is a graph showing changes in the isolation characteristics in the Rx band when the coupling coefficient is varied from κ=about 0 to κ=about 0.1, with respect to the first band. In FIG. 7, lines LN1 to LN5 indicate cases where κ=about 0, about 0.02, about 0.05, about 0.07, and about 0.1, respectively. As shown in FIG. 7, the insertion loss initially decreases gradually as the coupling coefficient K increases from 0, but the insertion loss then reverses and increases as the coupling coefficient κ increases once κ becomes greater than about 0.05.

FIG. 8 is a graph showing a relationship between the coupling coefficient κ and insertion loss. As shown in FIG. 8, the insertion loss decreases gradually as the coupling coefficient κ increases from about 0 to about 0.05, and the insertion loss then increases gradually as the κ increases from about 0.05.

For example, an isolation of greater than or equal to about 55 dB for the reception-side pass band (Rx band) may be desired. Thus, according to the first preferred embodiment, for example, parameters are preferably set to provide a range of about 0.04 to about 0.07 for the coupling coefficient κ.

As described thus far, a branching device (e.g., a triplexer) is able to transmit and receive in two bands in the first preferred embodiment, and the polarized inductors in the respective transmission filters are able to inductively couple with an input-side inductor that provides matching. Accordingly, the isolation characteristics of the reception-side pass bands of the common reception filter portion are able to be increased.

Variation of the First Preferred Embodiment

The arrangement of the polarized inductors on the circuit board is not limited to the arrangement shown in FIG. 2, and other arrangements may be applied as long as inductive coupling with the input-side inductor in the inductor chip is able to be provided.

Figure 9:
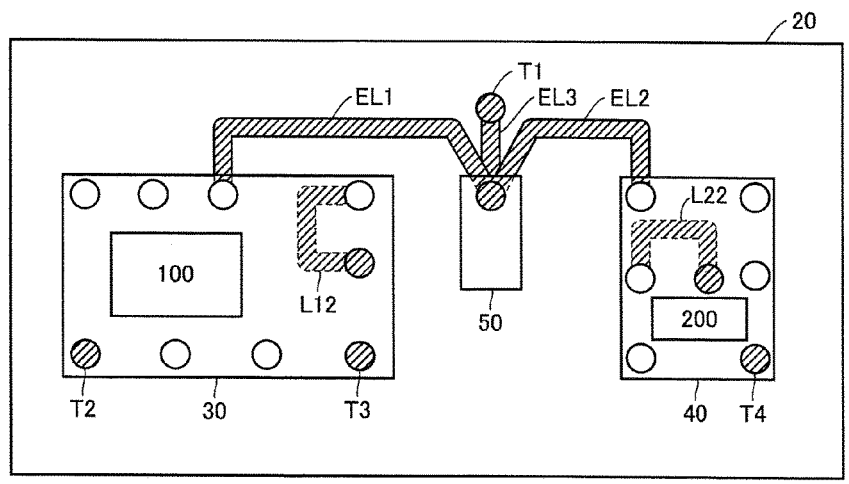
FIG. 9 is a diagram showing a second example of the overall arrangement on a circuit board of the respective elements and components of the branching device shown in FIG. 1.

FIG. 9 shows an example in which the inductor L22 is arranged to completely overlap with the filter chip 40 in the circuitry on the transmission filter 210 side.

Second Preferred Embodiment

The first preferred embodiment describes a configuration in which the reception-side filter is shared by two bands. However, a second preferred embodiment of the present invention, as described below, provides an example of a configuration including two duplexers (a quadruplexer) in which a reception-side filter is provided for each band.

Figure 10:
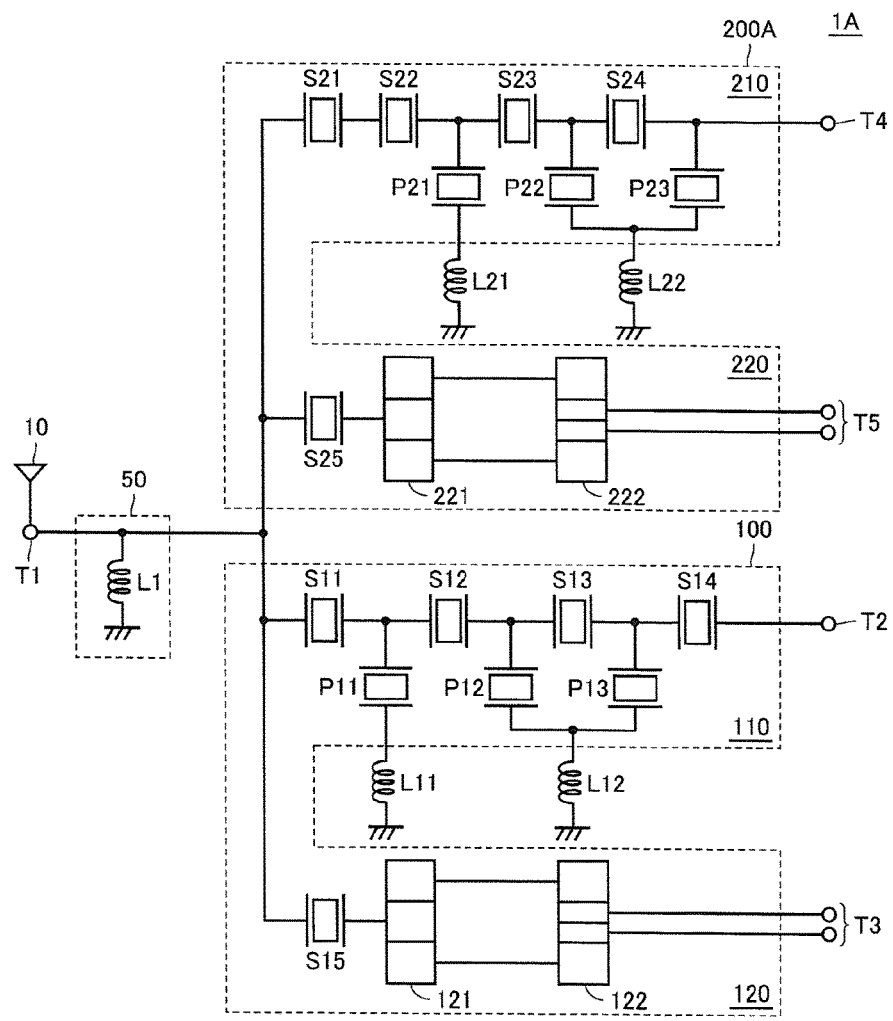
FIG. 10 is a schematic circuit diagram showing a branching device according to a second preferred embodiment of the present invention.

FIG. 10 is a schematic circuit diagram showing a branching device 1A according to the second preferred embodiment. As shown in FIG. 10, a separate reception filter 220 is provided for a band of the transmission filter 210 of the filter 200 in the branching device 1 shown in FIG. 1, and a duplexer 200A includes the transmission filter 210 and the reception filter 220. Elements and components in FIG. 10 that are the same as or similar to those in FIG. 1 will not be described again.

As shown in FIG. 10, the reception filter 220 in the duplexer 200A is a balanced filter corresponding to a third filter electrically connected between a reception terminal T5, which corresponds to a fifth signal terminal, and the antenna terminal T1. More specifically, the reception filter 220 includes longitudinally coupled resonator elastic wave filters. The reception filter 220 includes a surface acoustic wave resonator S25 and longitudinally coupled resonator elastic wave filters 221 and 222.

One end of the surface acoustic wave resonator S25 is electrically connected to the antenna terminal, and another end is electrically connected to the longitudinally coupled resonator elastic wave filter 221. The longitudinally coupled resonator elastic wave filter 221 and the longitudinally coupled resonator elastic wave filter 222 are longitudinally electrically connected to each other and implement balanced-unbalanced transforming operations. The reception filter 220 transforms an unbalanced signal received by the antenna 10 to a balanced signal through the surface acoustic wave resonator S25 and outputs the balanced signal to the reception terminal T5.

In the second preferred embodiment, the pass band of the reception filter 220 in the duplexer 200A may be the same as or a similar to the pass band of the reception filter 120 in the duplexer 100, or may be a different pass band.

Figure 11:
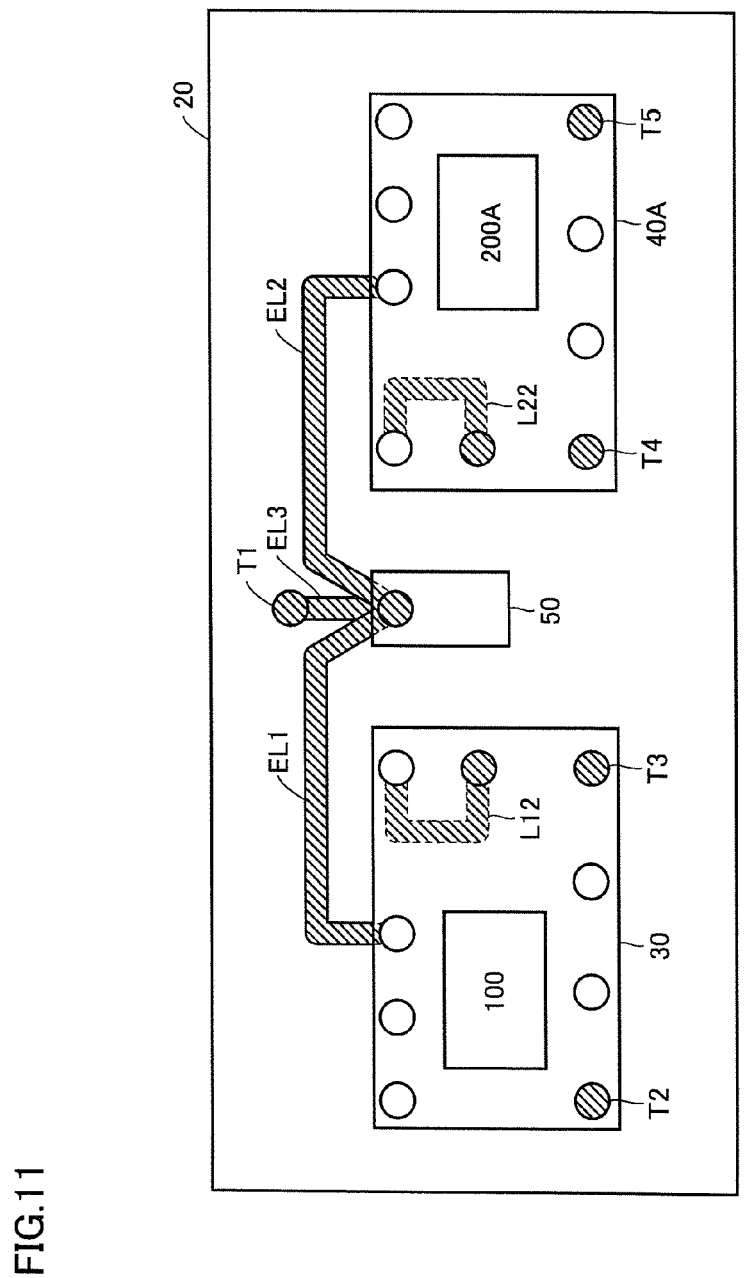
FIG. 11 is a diagram showing the overall arrangement on a circuit board of the respective elements and components of the branching device shown in FIG. 10.
Figure 12:
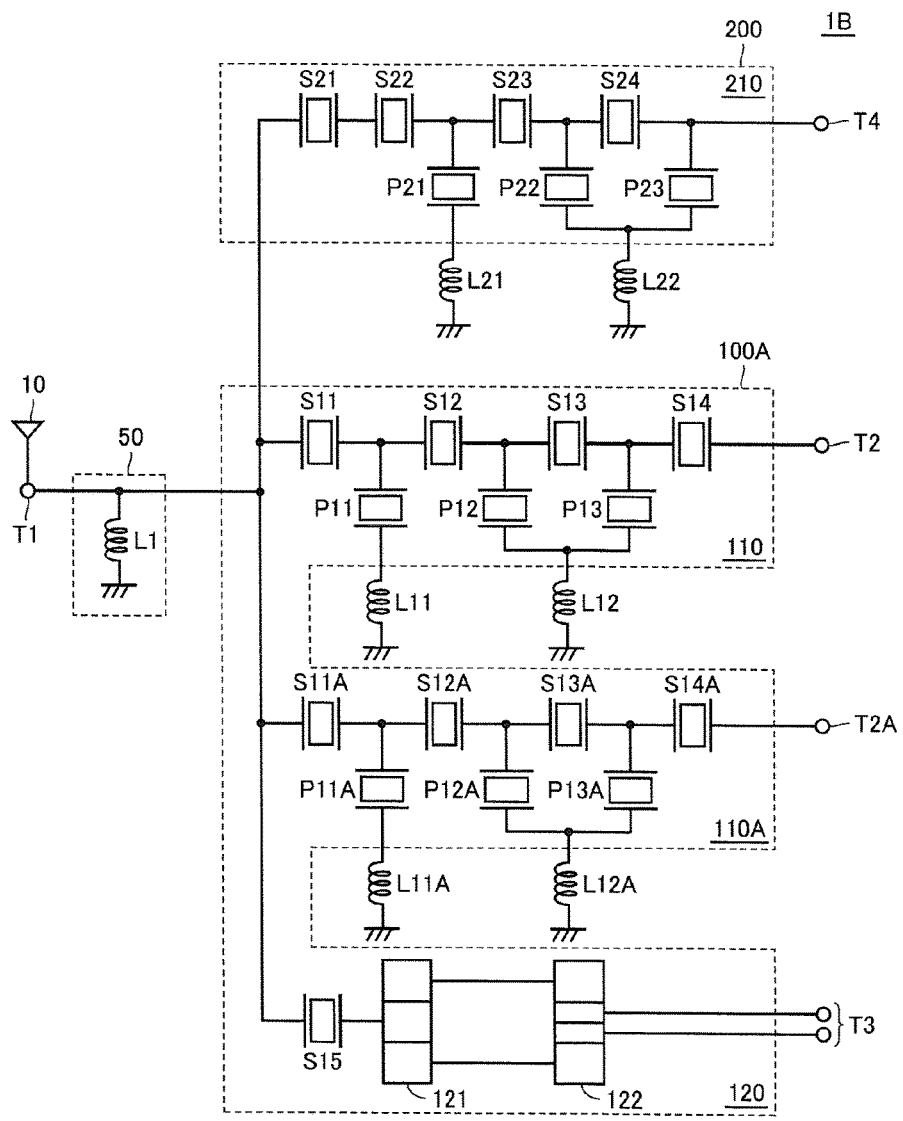
FIG. 12 is a schematic circuit diagram showing a branching device according to a third preferred embodiment of the present invention.

FIG. 11 is a diagram showing the overall arrangement on a circuit board 20 of the respective elements and components of the branching device shown in FIG. 10. In FIG. 11, a filter chip 40A including the duplexer 200A is mounted on the circuit board 20, instead of the filter chip 40 described in the first preferred embodiment with reference to FIG. 2. The filter chip and the filter chip 40A are arranged symmetrically or substantially symmetrically with respect to the inductor chip 50, and the polarized inductors L12 and L22 are each disposed near the inductor L1 in the inductor chip 50 to inductively couple with the inductor L1.

Accordingly, even in a branching device including two duplexers having a separate reception filter for each band, the isolation characteristics of the reception-side pass band are able to be increased by causing the polarized inductors in each duplexer to inductively couple with an input-side inductor.

Third Preferred Embodiment

A branching device 1B according to a third preferred embodiment of the present invention replaces the duplexer 100 of the first preferred embodiment with a triplexer 100A that includes two transmission filters 110 and 110A. In other words, the branching device 1B includes the transmission filters 110, 110A, and 210, which correspond to three different bands with mutually different pass bands, and the common reception filter 120.

Accordingly, even in the branching device 1B with at least three bands, by inductively coupling the polarized inductors L12, L12A, and L22 in the transmission filters 110, 110A, and 210, respectively, with the antenna-side inductor L1, the isolation characteristics of the reception-side pass bands of the respective bands are able to be increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A branching device comprising:
   first, second, third, and fourth signal terminals;
   a first filter, electrically connected to the first, second, and third signal terminals, the first filter providing first and second pass bands that are mutually different from each other;
   a second filter, electrically connected to the first and fourth signal terminals, the second filter providing a third pass band that is different from the first and second pass bands;
   a first inductor electrically connected between the first signal terminal and a ground potential;
   a second inductor electrically connected between the first filter and a ground potential; and
   a third inductor electrically connected between the second filter and a ground potential; wherein
   the first inductor inductively couples with the second inductor and the third inductor; and
   each of a distance between the first inductor and the second inductor and a distance between the first inductor and the third inductor is shorter than a distance between the second inductor and the third inductor.

2. The branching device according to claim 1, wherein the distance between the first inductor and the second inductor is the same or substantially the same as the distance between the first inductor and the third inductor.

3. The branching device according to claim 1, wherein a coupling coefficient between the first inductor and the second inductor and a coupling coefficient between the first inductor and the third inductor are both within a range of greater than or equal to about 0.04 and less than or equal to about 0.07.

4. The branching device according to claim 1, wherein the first filter includes:
   a first ladder filter that provides the first pass band and includes a first serial arm resonator and a first parallel arm resonator; and
   a longitudinally coupled resonator filter that provides the second pass band.

5. The branching device according to claim 1, wherein the second filter includes a second ladder filter that provides the third pass band and includes a second serial arm resonator and a second parallel arm resonator.

6. The branching device according to claim 1, wherein:
   the first filter includes a first serial arm resonator and a first parallel arm resonator;
   the second filter includes a second serial arm resonator and a second parallel arm resonator;
   the second inductor is electrically connected between the first parallel arm resonator and a ground potential; and
   the third inductor is electrically connected between the second parallel arm resonator and a ground potential.

7. The branching device according to claim 1, wherein:
   the first filter includes a plurality of first parallel arm resonators;
   the second filter includes a plurality of second parallel arm resonators;
   the second inductor is electrically connected between at least two parallel arm resonators of the plurality of first parallel arm resonators and a ground potential; and
   the third inductor is electrically connected between at least two parallel arm resonators of the plurality of second parallel arm resonators and a ground potential.

8. The branching device according to claim 1, further comprising:
   a fifth signal terminal; wherein
   the first filter includes:
      a first filter portion that is electrically connected to the first and second signal terminals and provides the first pass band; and
      a second filter portion that is electrically connected to the first and third signal terminals and provides the second pass band; and
   the second filter includes:
      a third filter portion that is electrically connected to the first and fourth signal terminals and provides the third pass band; and
      a fourth filter portion that is electrically connected to the first and fifth signal terminals and provides a fourth pass band that is different from the third pass band.

9. The branching device according to claim 1, wherein:
the first, second, third and fourth signal terminals are provided on a circuit board;
the first filter is included in a first filter chip mounted on the circuit board;
the second filter is included in a second filter chip mounted on the circuit board;
the first inductor is included in an inductor chip mounted on the circuit board;
the second inductor is disposed on the circuit board to at least partially overlap with the first filter chip when the circuit board is viewed in plan view; and
the third inductor is disposed on the circuit board to at least partially overlap with the second filter chip when the circuit board is viewed in plan view.

10. The branching device according to claim 9, wherein the first filter chip and the inductor chip are electrically connected to each other by a first interconnect pattern on the circuit board.

11. The branching device according to claim 9, wherein the second filter chip and the inductor chip are electrically connected to each other by a second interconnect pattern on the circuit board.

12. The branching device according to claim 9, wherein the inductor chip is electrically connected to an antenna terminal by a third interconnect pattern on the circuit board.

13. The branching device according to claim 9, wherein the third inductor chip completely overlaps the second filter chip when the circuit board is seen in plan view.

14. The branching device according to claim 4, wherein the longitudinally coupled resonator filter is electrically connected to one end of a surface acoustic wave resonator.

15. The branching device according to claim 14, wherein another end of the surface acoustic wave resonator is electrically connected to an antenna terminal.

16. The branching device according to claim 8, wherein the second filter includes a longitudinally coupled resonator filter that provides the fourth pass band.

17. The branching device according to claim 6, wherein the second inductor and the third inductor provide a series electrical connection of a load capacitance.

18. The branching device according to claim 1, wherein at least one of the first and second pass bands is between about 704 MHz and about 716 MHz, between about 734 MHz and about 756 MHz, or between about 777 MHz and about 787 MHz.

* * * * *